United States Patent [19]

Agata

[11] Patent Number: 5,629,903
[45] Date of Patent: May 13, 1997

[54] SEMICONDUCTOR MEMORY DEVICE

[75] Inventor: Masashi Agata, Osaka, Japan

[73] Assignee: Matsushita Electronics Corporation, Osaka, Japan

[21] Appl. No.: 632,826

[22] Filed: Apr. 16, 1996

[30] Foreign Application Priority Data

Apr. 18, 1995 [JP] Japan ................................. 7-092035

[51] Int. Cl.$^6$ ........................................... G11C 8/00
[52] U.S. Cl. ..................... 365/233; 365/230.06; 365/236
[58] Field of Search .................... 365/233, 233.5, 365/230.06, 236, 189.08

[56] References Cited

U.S. PATENT DOCUMENTS

| | | | |
|---|---|---|---|
| 4,931,998 | 6/1990 | Ootani et al. | 365/230.06 |
| 5,119,334 | 6/1992 | Fujii | 365/230.06 |
| 5,357,479 | 10/1994 | Matsui | 365/230.06 |
| 5,566,119 | 10/1996 | Matano | 365/230.06 |

OTHER PUBLICATIONS

Fujiwara et al., "A 200MHz 16Mbit Synchronous DRAM with Block Access Mode", 1994 Symposium on VLSI Circuits Digest of Technical Papers, pp. 79–80.

*Primary Examiner*—Tan T. Nguyen
*Attorney, Agent, or Firm*—McDermott, Will & Emery

[57] ABSTRACT

This invention discloses a synchronous DRAM. An address counter provides a column address of eight bits. The low-order four bits of the column address are assigned to a first column predecoder while the high-order four bits are assigned to a second column predecoder. The first column predecoder provides first predecode signals which are activated in synchronization with a clock leading edge of an internal clock signal and deactivated in synchronization with a clock trailing edge subsequent to the clock leading edge. The second column predecoder provides second predecode signals which make a transition in synchronization with the clock trailing edge. A column decoder sequentially activates column-select lines of a memory cell array according to the AND obtained from all combinations of the first predecode signals and the second predecode signals. Fast, low power column-select line activation is accomplished accordingly.

2 Claims, 5 Drawing Sheets

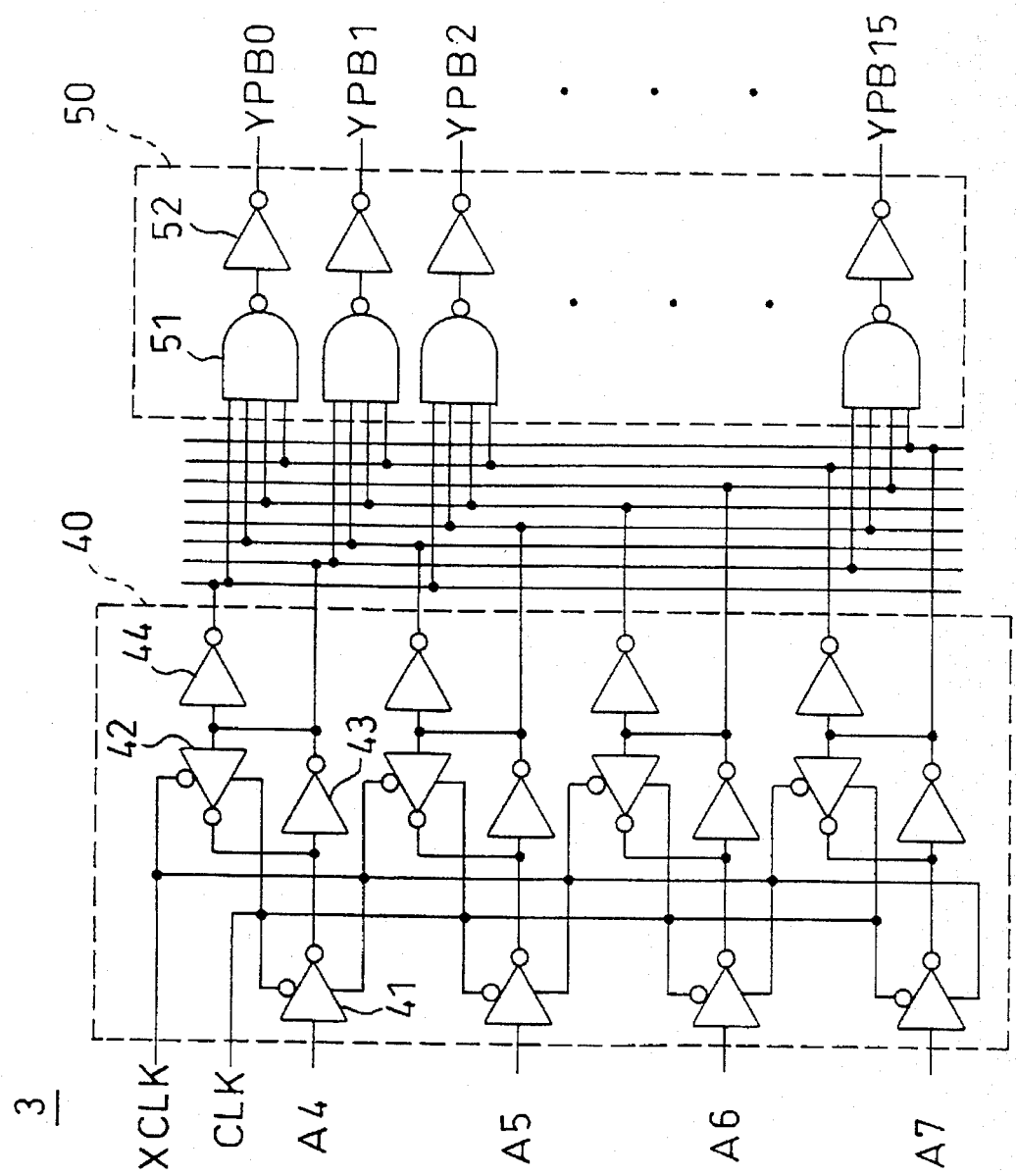
F I G. 3

SEMICONDUCTOR MEMORY DEVICE

BACKGROUND OF THE INVENTION

This invention relates to a semiconductor memory device capable of reading data in synchronization with a clock signal.

SDRAM (synchronous DRAM) is a clock-synchronized, fast-access MOS semiconductor memory device. Fujiwara and others show a column address decode circuit for SDRAM with high speed and low power capabilities ("A 200 MHz 16 Mbit Synchronous DRAM with Block Access Mode," 1994 Symp. on VLSI Cir. Dig. of Tech. Papers, pp. 79–80). In accordance with this technique, column-select line activation is made by an AND signal of a column decode signal (i.e., an AND signal of plural predecode signals) and an internal clock signal. The column-select line is activated in synchronization with a clock leading edge and deactivated in synchronization with a clock trailing edge subsequent to that clock leading edge.

The above-described column decode circuit however has some drawbacks. For example, if 256 column-select lines are arranged, then 256 AND circuits must be driven by internal clock signals. This increases the clock driver load. The power dissipation increases and the speed of operations including clock drive operations decreases.

SUMMARY OF THE INVENTION

Accordingly, it is an object of the present invention to provide an improved semiconductor memory device capable of reading data in synchronization with a clock signal. More specifically, this invention provides a technique that achieves fast, low power column-select line activation.

A semiconductor memory device made in accordance with the present invention has a column predecoder. The column predecoder (A) activates signals generated by decoding a plurality of low-order bits of a column address sequentially updated by an address counter, in synchronization with one of two consecutive clock edges of a clock signal, one of which is a clock leading edge and the other of which is a clock trailing edge, (B) deactivates the signals in synchronization with the other clock edge, and (C) provides the signals in the form of first predecode signals. AND signals, obtained from all combinations of the first predecode signals and second predecode signals generated by decoding a plurality of high-order bits of the column address, each become an activation signal for activating a column-select line.

In accordance with the present invention, only decode results, obtained by decoding the low-order column address bits, are activated in synchronization with one of two consecutive clock edges, are deactivated in synchronization with the other clock edge, and are provided in the form of first predecode signals. An AND signal of a first predecode signal and a second predecode signal becomes an activation signal for activating a column-select line. Therefore, a column-select line is activated in synchronization with one of a clock leading edge and a clock trailing edge in series and deactivated in synchronization with the other clock edge, as in the conventional technique. The present invention is able to provide the same effect as the conventional technique. In addition to this, the present invention can reduce the clock driver load. One advantage of the present invention is that it achieves fast, low power column-select line activation.

BRIEF DESCRIPTION OF THE DRAWINGS

FIG. 3 is a circuit diagram showing an internal structure of a second column predecoder shown in FIG. 1.

DETAILED DESCRIPTION OF THE INVENTION

Referring now to FIGS. 1–5, one embodiment of this invention is described below.

Figure 1:
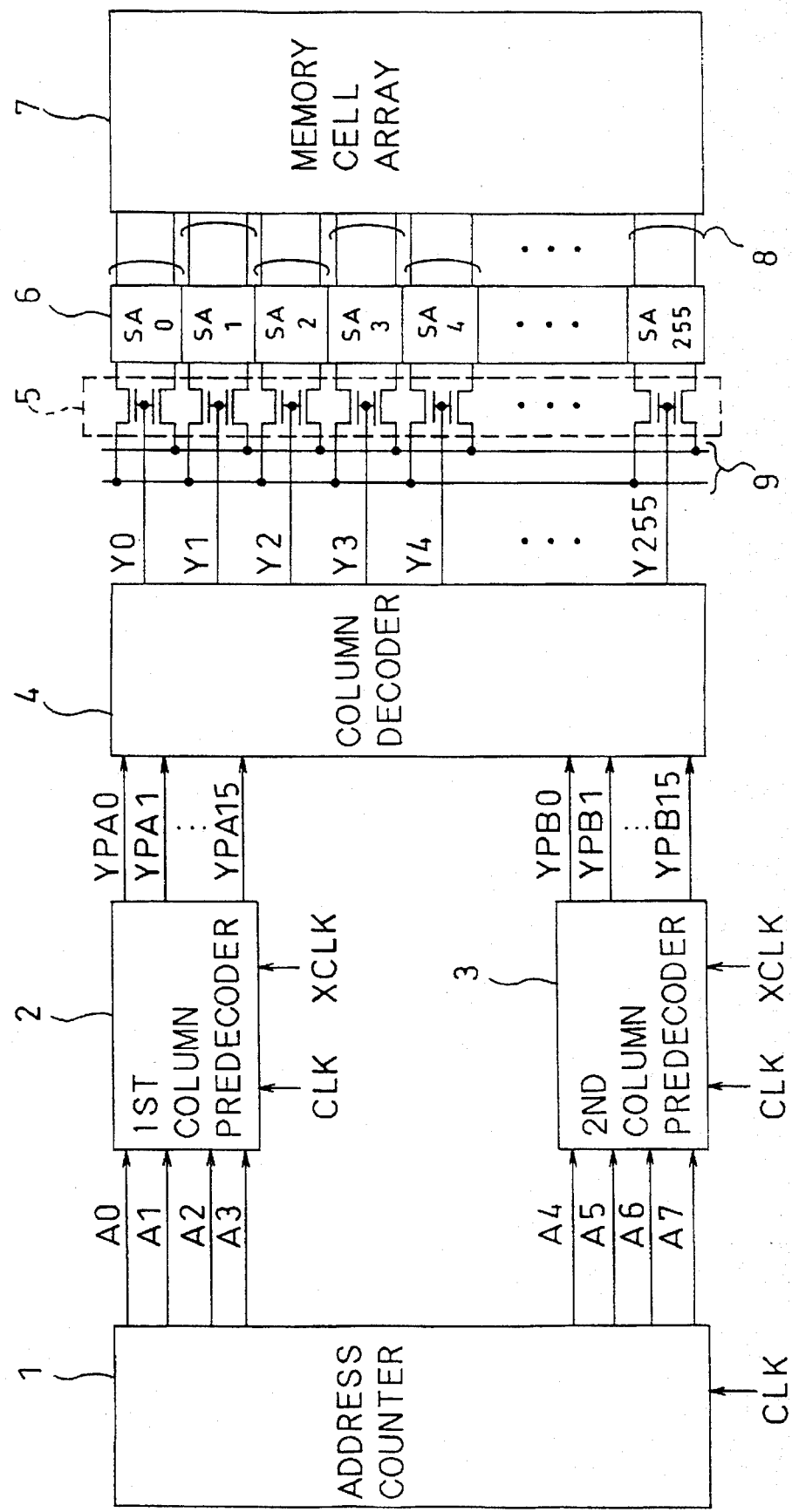
FIG. 1 is a block diagram roughly showing a structure of an SDRAM made in accordance with an embodiment of the present invention.

FIG. 1 block diagrams an SDRAM made in accordance with an embodiment of the present invention. 1 is an address counter. In synchronization with the internal clock (CLK) signal, the address counter 1 performs continuous updating and sequential provision of 8-bit column addresses according to the designated initial address and burst length. Each 8-bit column address is formed of eight column address bits A0–A7 of which the bits A0–A3 and A4–A7 are low- and high-order bits, respectively. 2 is a first column predecoder. The first column predecoder 2 generates, from the low-order four bits A0–A3, first predecode signals YPA0–YPA15. 3 is a second column predecoder. The second column predecoder 3 generates, from the high-order four bits A4–A7, second predecode signals YPB0–YPB15. A clock driver (not illustrated) applies both an internal CLK signal and a complementary clock (XCLK) signal which is a reverse signal of the internal CLK signal, to each column predecoder 2 and 3. 4 is a column decoder. This column decoder 4 generates, based on all combinations of the first predecode signals YPA0–YPA15 and the second predecode signals YPB0–YPB15, activation signals for activation of 256 column-select lines Y0–Y255.

5 is a bank of 256 column switches. Each column switch is composed of two NMOS transistors whose gates are coupled in common to one of the column-select lines Y0–Y255. 6 is a bank of sense amplifiers. 7 is an array of memory cells. 8 is 256 pairs of bit lines associated with the memory cell array 7. 9 is a pair of data buses. The column switch bank 5 is arranged between the bit line 8 and the data bus 9. The sense amplifier bank 6 is arranged above the bit line 8. When any of the column-lines Y0–Y255 is brought into an active state, data is read out onto the data bus 9 through a corresponding column of the memory cell array 7. A row address decode circuit and other circuits are not illustrated.

Figure 2:
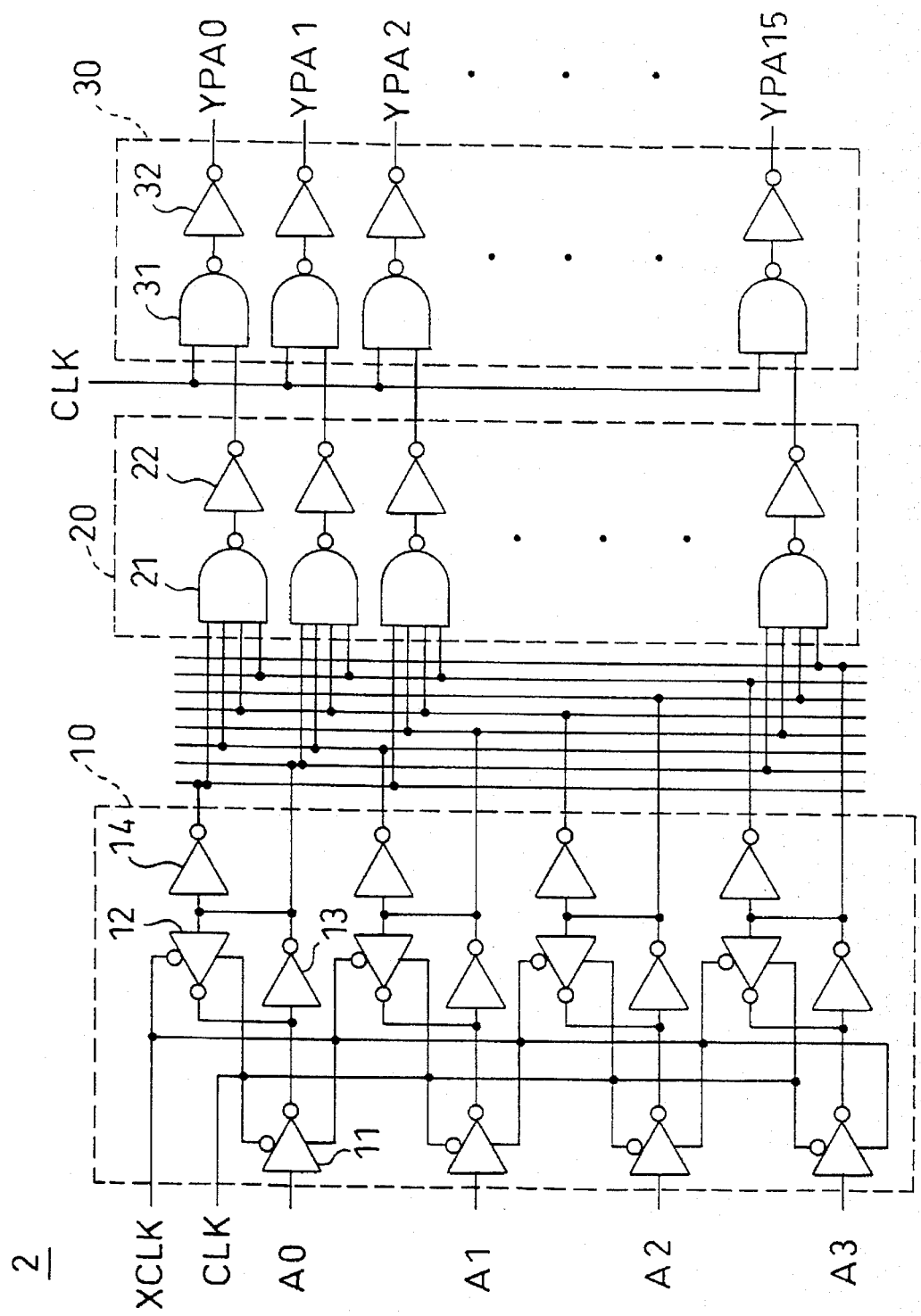
FIG. 2 is a circuit diagram showing an internal structure of a first column predecoder shown in FIG. 1.

FIG. 2 shows an internal structure of the first column predecoder 2. The first column predecoder 2 has an address latch circuit 10, a first AND circuit 20, and a second AND circuit 30. The address latch circuit 10 has four unit circuits. Each unit circuit has two clocked inverters 11 and 12 and two inverters 13 and 14. The address latch circuit 10 receives the low-order four bits A0–A3 on a CLK trailing edge of the internal CLK signal, latches A0–A3 on a CLK leading edge subsequent to the CLK trailing edge, and provides eight 1-bit signals A0, /A0, A1, /A1, A2, /A2, A3 and /A3. The first AND circuit 20 is composed of sixteen unit circuits for decoding the low-order four bits A0–A3. Each unit circuit contains a 4-input NAND circuit 21 and an inverter 22. The first of the sixteen unit circuits provides a HIGH level Output (logical 1) when (A0, A1, A2, A3)=(0, 0, 0, 0). The second unit circuit provides a HIGH level output when (A0, A1, A2, A3)=(1, 0, 0, 0). The third unit circuit provides a HIGH level output when (A0, A1, A2, A3)=(0, 1, 0, 0). The sixteenth unit circuit provides a HIGH level output when (A0, A1, A2, A3)=(1, 1, 1, 1). The second AND circuit 30 is composed of sixteen unit circuits each of which contains a 2-input NAND circuit 31 and an inverter 32. The 2-input NAND circuit 31 receives an internal CLK signal at one of its two inputs and an output from a unit circuit of the first AND circuit 20 at the other input. The second AND circuit 30 supplies to the column decoder 4 a first predecode signal YPA which is activated in synchronization with a CLK leading edge and deactivated in synchronization with a subsequent CLK trailing edge.

The internal structure of the second column predecoder 3 is illustrated with reference to FIG. 3. The second column predecoder 3 has an address latch circuit 40 and an AND circuit 50. This address latch circuit 40 is composed of four unit circuits each of which contains two clocked inverters 41 and 42 and two inverters 43 and 44. The address latch circuit 40 receives the high-order four bits A4–A7 on a CLK trailing edge, latches the bits A4–A7 on a subsequent CLK leading edge, and provides eight 1-bit signals A4, /A4, A5, /A5, A6, /A6, A7 and/A7. The AND circuit 50 is composed of sixteen unit circuits for decoding the high-order four bits A4–A7. Each of these sixteen unit circuits contains a 4-input NAND circuit 51 and an inverter 52. The first of the sixteen unit circuits provides a HIGH level output (logical 1), YPB0, when (A4, A5, A6, A7)=(0, 0, 0, 0). The second unit circuit provides a HIGH level output, YPB1, when (A4, A5, A6, A7)=(1, 0, 0, 0). The third unit circuit provides a HIGH level output, YPB2, when (A4, A5, A6, A7)=(0, 1, 0, 0). The sixteenth unit circuit provides a HIGH level output, YPB15, when (A4, A5, A6, A7)=(1, 1, 1, 1). The outputs YPB0–YPB15, which make a transition on a CLK trailing edge, are supplied as second predecode signals to the column decoder 4.

Figure 4:
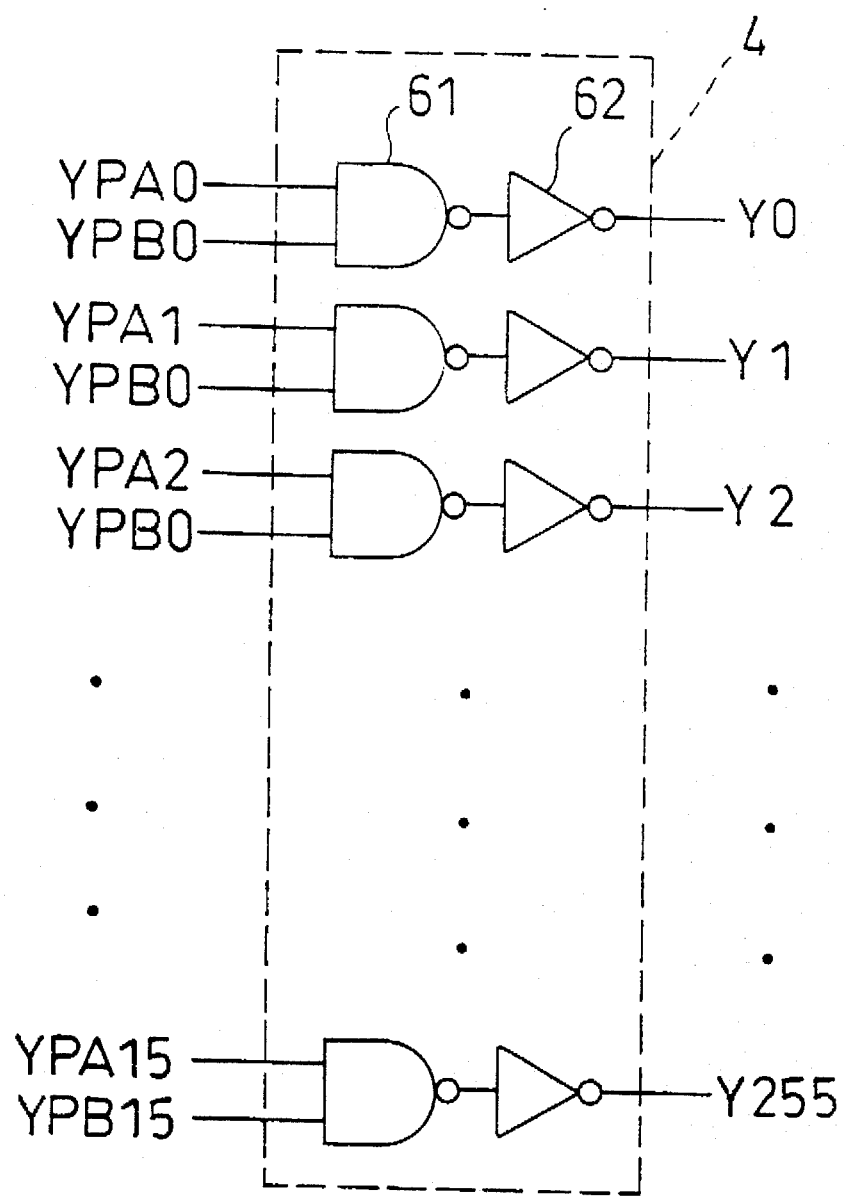
FIG. 4 is a circuit diagram depicting an internal structure of a column decoder shown in FIG. 1.

Referring now to FIG. 4, the internal structure of the column decoder 4 is described. The column decoder 4 is made up of 256 unit circuits each of which contains a 2-input NAND circuit 61 and an inverter 62. The first of the 256 unit circuits in the column decoder 4 activates the first column-select line Y0 to a HIGH level when (YPA0, YPB0)=(1, 1). The second unit circuit activates the second column-select line Y1 to a HIGH level when (YPA1, YPB0)=(1, 1). The third unit circuit activates the third column-select line Y2 to a HIGH level when (YPA2, YPB0)=(1, 1). The 256th unit circuit activates the 256th column-select line Y255 to a HIGH level when (YPA15, YPB15)=(1, 1).

Figure 5:
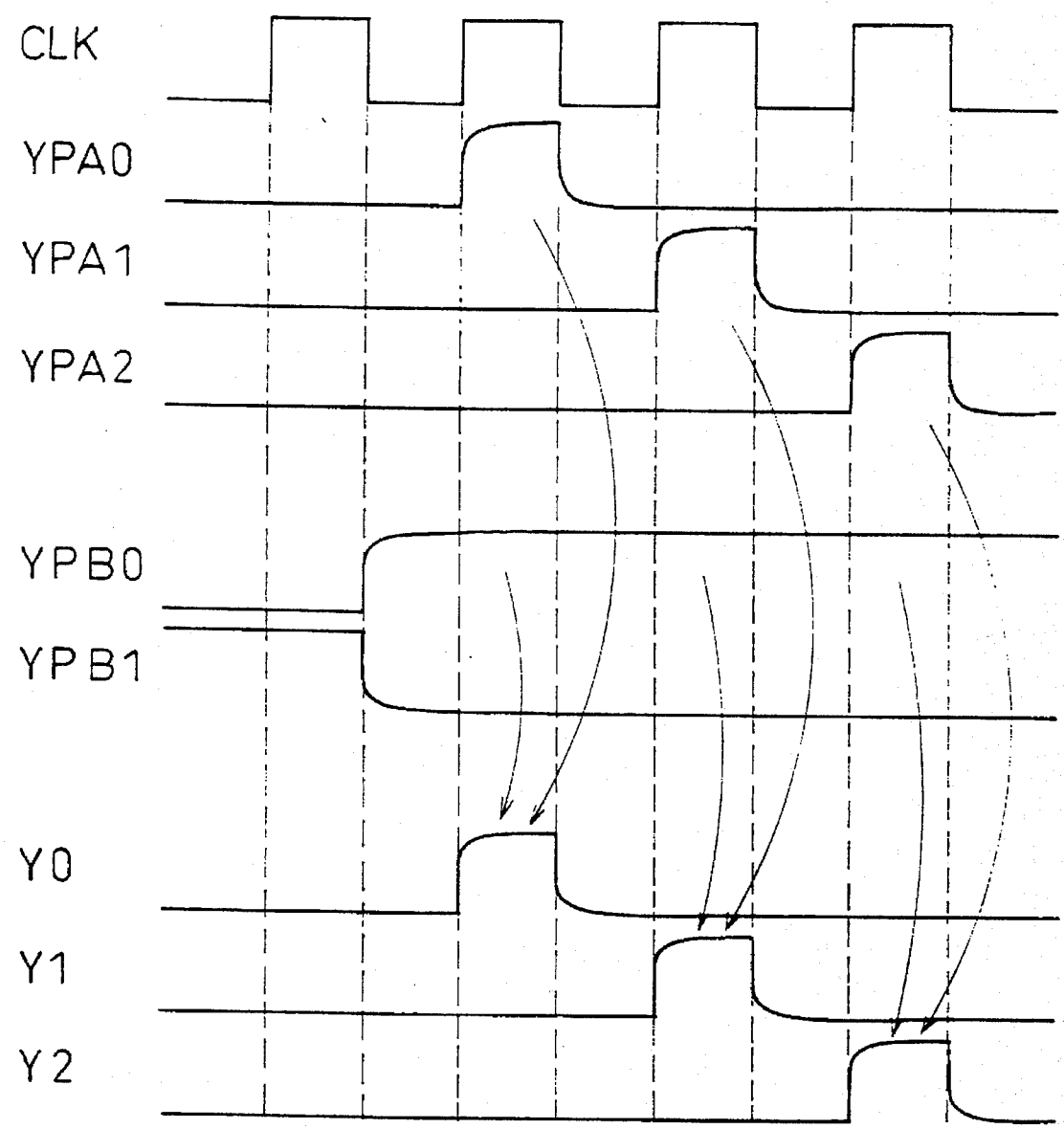
FIG. 5 is a timing chart useful in understanding the operation of the FIG. 1 SDRAM.

Referring to FIG. 5, the operation of the FIG. 1 SDRAM is described. The address counter 1 increments the column address bits A0–A7 by one within the range defined by the designated initial address and burst length.

The first column predecoder 2 receives A0–A3 (the low-order four bits of the column address) on a CLK trailing edge. These column address bits A0–A3 are decoded in the first AND circuit 20. Each result of the decoding operation and the internal CLK signal are ANDed in the second AND circuit 30. Therefore, the first predecode signals YPA0–YPA15 are activated to a HIGH level in synchronization with a CLK leading edge and deactivated in synchronization with a trailing edge subsequent to the CLK leading edge (see FIG. 5). As a result of such arrangement, the first predecode signals YPA0–YPA15, which have been activated one by one for every clock correspondingly to the low-order four bits A0–A3, are sequentially supplied to the column decoder 4 in synchronization with the internal CLK signal. Once the column address bits A0–A3 are latched in the address latch circuit 10 on a CLK leading edge, the column address bits A0–A8 may be updated by the time of a subsequent CLK trailing edge.

The second column predecoder 3 receives A4–A7 (i.e., the high-order four bits of the column address) on a CLK trailing edge. These column address bits A4–A7 are decoded in the AND circuit 50. The second predecode signals YPB0–YPB15, which make a transition on a CLK trailing edge correspondingly to the column address bits A4–A7, are supplied to the column decoder 4, as shown in FIG. 5. Once the column address bits A4–A7 are latched in the address latch circuit 40 on a CLK leading edge, the column address bits A4–A7 may be updated by the time of a subsequent CLK trailing edge. The high-order four bits A4–A7 are updated less frequently than the low-order four bits A0–A3.

The column decoder 4 activates a column-select line Y according to the AND of the first predecode signal YPA and the second predecode signal YPB. The column-select lines Y0–Y255 are activated to a HIGH level in synchronization with a CLK leading edge and deactivated to a LOW level in synchronization with the subsequent CLK trailing edge. An arbitrary number of column-select lines of all the 256 column-select lines Y0–Y255 are activated sequentially for every clock correspondingly to the column address bits A0–A7 which are sequentially incremented.

If the AND circuit 30 of FIG. 2 is removed, and if (A) a 2-input NAND circuit for computing the AND of the output signal from the inverter 62 and the internal CLK signal and (B) an inverter for inverting the output of this 2-input NAND circuit are arranged in each of the 256 unit circuits of the column decoder 4 of FIG. 4, then 256 2-input NAND circuits must be driven by the internal CLK signal. This increases the clock driver load. Conversely, in the present embodiment, the number of NAND circuits (i.e., the number of the NAND circuits 31 of FIG. 2) necessary for achieving the same functions is sixteen. This greatly decreases the clock driver load. Accordingly the charge/discharge current is reduced and the power dissipation of SDRAM is reduced. Additionally, fast SDRAM operations including internal clock signal generation can be accomplished since the internal clock signal load is light.

In the present embodiment, the address latch circuit 40 in the second column predecoder 3 receives the high-order four bits A4–A7 on a CLK trailing edge and latches these bits on a CLK leading edge subsequent to the CLK trailing edge. However, it may be arranged such that the address latch circuit 40 receives the bits A4–A7 on a CLK leading edge and latches them on the subsequent CLK trailing edge.

Additionally, it is possible to employ a structure in which the first predecode signals YPA0–YPA15 are activated to a HIGH level in synchronization with a CLK trailing edge and deactivated to a LOW level in synchronization with the subsequent CLK leading edge.

In the present embodiment, half of the column address bits A0–A7 are assigned to the first column predecoder 2 while the other half are assigned to the second column predecoder 3, since some column-select lines of the 256 column-select lines are selected one by one. Such assignment may be changed according to the number of column-select lines to be selected.

The invention claimed is:

1. A semiconductor memory device capable of reading data in a clock-synchronized manner, comprising:

a memory cell array wherein, when any one of plural column-select lines are activated, data is read out of a corresponding column of said memory cell array;

an address counter for continuously updating column addresses in synchronization with a clock signal and for sequentially providing said column addresses thus updated;

a first column predecoder for activating signals generated by decoding plural low-order bits of said column addresses in synchronization with one of two consecutive clock edges of said clock signal, one of which is a clock leading edge and the other of which is a clock trailing edge, for deactivating said signals in synchronization with the other clock edge, and for providing said signals in the form of first predecode signals;

a second column predecoder for providing signals generated by decoding plural high-order bits of said column addresses in the form of second predecode signals; and a column decoder for providing AND signals obtained from all combinations of said first predecode signals and said second predecode signals in the form of signals for activation of said plural column-select lines.

2. A semiconductor memory device according to claim 1 wherein said first column predecoder has an AND circuit for providing AND signals of signals generated by decoding plural low-order bits of said column addresses and said clock signal, in the form of said first predecode signals.

* * * * *